US012740096B2

(12) United States Patent
Yanagigawa

(10) Patent No.: US 12,740,096 B2
(45) Date of Patent: Sep. 15, 2026

(54) SEMICONDUCTOR DEVICE

(71) Applicant: Renesas Electronics Corporation, Tokyo (JP)

(72) Inventor: Hiroshi Yanagigawa, Tokyo (JP)

(73) Assignee: Renesas Electronics Corporation, Tokyo (JP)

( * ) Notice: Subject to any disclaimer, the term of this patent is extended or adjusted under 35 U.S.C. 154(b) by 341 days.

(21) Appl. No.: 18/603,396

(22) Filed: Mar. 13, 2024

(65) Prior Publication Data

US 2024/0363747 A1 Oct. 31, 2024

(30) Foreign Application Priority Data

Apr. 26, 2023 (JP) ................................ 2023-072494

(51) Int. Cl.
*H10D 30/66* (2025.01)
*H10D 62/10* (2025.01)
*H10D 62/17* (2025.01)

(52) U.S. Cl.
CPC ......... *H10D 30/668* (2025.01); *H10D 62/106* (2025.01); *H10D 62/393* (2025.01)

(58) Field of Classification Search
CPC .. H10D 30/668; H10D 62/106; H10D 62/393; H10D 30/0297; H10D 62/127; H10D 64/2527; H10D 64/519
See application file for complete search history.

(56) References Cited

U.S. PATENT DOCUMENTS 8,575,707 B2 11/2013 Tamaki et al.
11,362,207 B2 6/2022 Sakai
2015/0340480 A1 11/2015 Matsuura
2018/0358433 A1 12/2018 Su et al.
2021/0159331 A1 * 5/2021 Sakai .................. H10D 30/665
2023/0352521 A1 * 11/2023 Nabuchi ............. H10D 30/668

FOREIGN PATENT DOCUMENTS

JP 2012-142336 A 7/2012
JP 2021-82770 A 5/2021

OTHER PUBLICATIONS

Office Action dated Apr. 21, 2026, issued in corresponding German patent application No. 10 2024 203 920.9.

* cited by examiner

*Primary Examiner* — Karen Kusumakar
(74) *Attorney, Agent, or Firm* — Rimon P.C.

(57) ABSTRACT

The semiconductor device includes a pair of gate-electrodes GE formed inside the pair of trenches TR via an gate insulating film (GI), respectively. The pair of column regions PC are spaced apart from each other in the Y-direction. The pair of trenches TR are provided apart from each other in the Y direction, are provided between the pair of column regions PC in the Y direction, and extend in the X direction. The ends of the pair of trenches TR in the X direction are connected to each other by a connecting portion TRa extending in the Y direction. The connection portion TRa is integrated with the pair of trenches TR. The pair of column regions PC extend in the X direction along the pair of trenches TR, and extend in the X direction toward the outer edge of the semiconductor substrate beyond the connection portion TRa.

6 Claims, 12 Drawing Sheets

PC
PW
B
PC
CH3
GW
OR
GEa
TRa
PB
B
A
A
CR
1A
CH2
SE
TR
GE
CH1
SE
GE
TR
CH2
SE
NS
NS
NS
UC
UC
UC
X
Y
Z

A-A Section

FIG. 5

B-B Section

A-A Section

A-A Section

FIG. 8

A-A Section

SUB
PC
NV
ND
TR
GI
GE
TR
GI
GE
PC
Z
Y
X

FIG. 11

A-A Section

SEMICONDUCTOR DEVICE

CROSS-REFERENCE TO RELATED APPLICATIONS

The disclosure of Japanese Patent Application No. 2023-072494 filed on Apr. 26, 2023, including the specification, drawings and abstract is incorporated herein by reference in its entirety.

BACKGROUND

The present disclosure relates to a semiconductor device, and more particularly, to a semiconductor device including a gate electrode formed in a trench.

In a semiconductor device such as a power MOSFET (Metal Oxide Semiconductor Field Effect Transistor), a structure of a PN junction called a super-junction structure (SJ structure) is known as a structure for improving a breakdown voltage. In an n-type MOSFET, a p-type column region is two-dimensionally arranged in an n-type drift region, so that the periphery of the column region is depleted and the breakdown voltage can be improved.

There are disclosed techniques listed below.

[Patent Document 1] Japanese Unexamined Patent Application Publication No. 2021-82770

[Patent Document 2] Japanese Unexamined Patent Application Publication No. 2012-142336

Patent Document 1 discloses a multi-trench SJ structure in which a single unit cell is provided with a pair of trench gates. The multi-trench SJ structure can reduce the on-resistance compared to a structure in which one trench gate is provided in one unit cell.

As shown in FIG. 22 of Patent Document 1, the column region in the cell region is arranged in a stripe shape along the extending direction of the trench gate, and the column region in the outer peripheral region is arranged in a circular shape so as to surround the cell region. In the multi-trench SJ configuration, a portion that is difficult to be depleted is generated in the outer peripheral region. Therefore, in Patent Document 1, a connection portion for connecting terminal portions of a pair of trench gates is provided, and a column region adjoining the pair of trench gates is extended toward the outer peripheral region, thereby achieving depletion of the portion.

Patent Document 2 discloses a SJ configuration in which a column area is applied to a planar MOSFET. The column region is arranged in a stripe shape along the extending direction of the gate electrode. In the outer peripheral region, a column region extending from the cell region and a column region extending in a direction orthogonal to the extending direction of the gate electrode are mixed.

SUMMARY

FIG. 12 shows a semiconductor device of examined example that the inventor has studied further on the basis of FIG. 22 and FIG. 23 of Patent Document 1. As shown in FIG. 12, the pair of trenches TR extends in the X-direction, and a pair of gate-electrodes GE is formed inside the pair of trenches TR. The pair of trenches TR are connected at the connecting portion TRa, and the pair of gate-electrodes GE are connected by a lead-out portion GEa formed inside the connecting portion TRa.

In the cell region CR, the p-type column region PC1 extends in the X-direction along the trench TR to the vicinity of the connecting portion TRa. In the outer peripheral region OR, a circular-shaped p-type column region PC2 is arranged so as to surround the cell region CR. FIG. 12 shows a column region PC2 extending in the Y-direction in the circular column region PC2.

According to a further study by the inventor of the present application, it has been found that in order to ensure the charge balance of achieving both the improvement of the breakdown voltage and the reduction of the on-resistance, two elements of “the width W1 of the column region PC1 of the cell region CR” and “the distance L1 between the column region PC1 and the column region PC2” need to be considered.

While the on-resistance is adjusted in the width W1, when the width W1 is changed in order to design an optimum on-resistance for a certain product, the distance L1 needs to be adjusted in order to ensure the withstand voltage. In order to derive these optimum values, a prototype of the width W1 and the multiplier of the distance L1 is required. For example, when 10 prototypes are manufactured for the width W1 and the distance L1, a total of 100 prototypes are required. Therefore, there is a problem that the development cost increases and the development period increases. Since the device conditions such as the impurity concentration of each of the column region PC1 and the column region PC2 are changed depending on the product specifications required in the market, the optimum value must be derived each time.

An object of the present application is to provide a semiconductor device capable of achieving both an improvement in breakdown voltage and a reduction in on-resistance, and to provide a technique capable of suppressing an increase in development cost and a prolonged development.

Other objects and novel features will become apparent from the description of this specification and the accompanying drawings.

The typical ones of the embodiments disclosed in the present application will be briefly described as follows.

A semiconductor device according to one embodiment comprises a plurality of unit cells formed in a semiconductor substrate of a first conductivity type having an upper surface and a lower surface. Each of the plurality of the unit cells has a body region of a second conductivity type opposite to the first conductivity type formed at a position closer to the upper surface than to the lower surface in the semiconductor substrate, a source region of the first conductivity type formed in the body region, a pair of column regions of the second conductivity type formed below the body region in the semiconductor substrate, a pair of trenches formed in the semiconductor substrate so as to go through the source region and the body region and to reach a predetermined depth from the upper surface of the semiconductor substrate and a pair of gate electrodes formed inside the pair of the trenches respectively via a gate insulating film. The pair of the column regions are provided apart from each other in a first direction in plan view. The pair of the trenches are provided apart from each other in the first direction, between the pair of the column regions in the first direction, and extending in a second direction orthogonal to the first direction in plan view. Edges of respective trenches of the pair of the trenches in the second direction are connected to each other by a connecting portion extending in the first direction. The connecting portion is integrated with the pair of the trenches. The pair of the column regions are extending in the second direction along the pair of the trenches and are extending in the second direction beyond the connecting portion toward an outer edge of the semiconductor substrate.

According to an embodiment, it is possible to provide a semiconductor device capable of achieving both an improvement in breakdown voltage and a reduction in on-resistance, and to provide a technique capable of suppressing an increase in development cost and a prolonged development.

BRIEF DESCRIPTION OF THE DRAWINGS

FIG. 3 is a main portion plan view indicating the semiconductor device in the first embodiment.

FIG. 5 is a cross-sectional view indicating semiconductor device in first embodiment.

FIG. 8 is a cross-sectional view illustrating a manufacturing process following FIG. 7.

FIG. 11 is a cross-sectional view illustrating a manufacturing step following FIG. 10.

DETAILED DESCRIPTION

Figure 1:
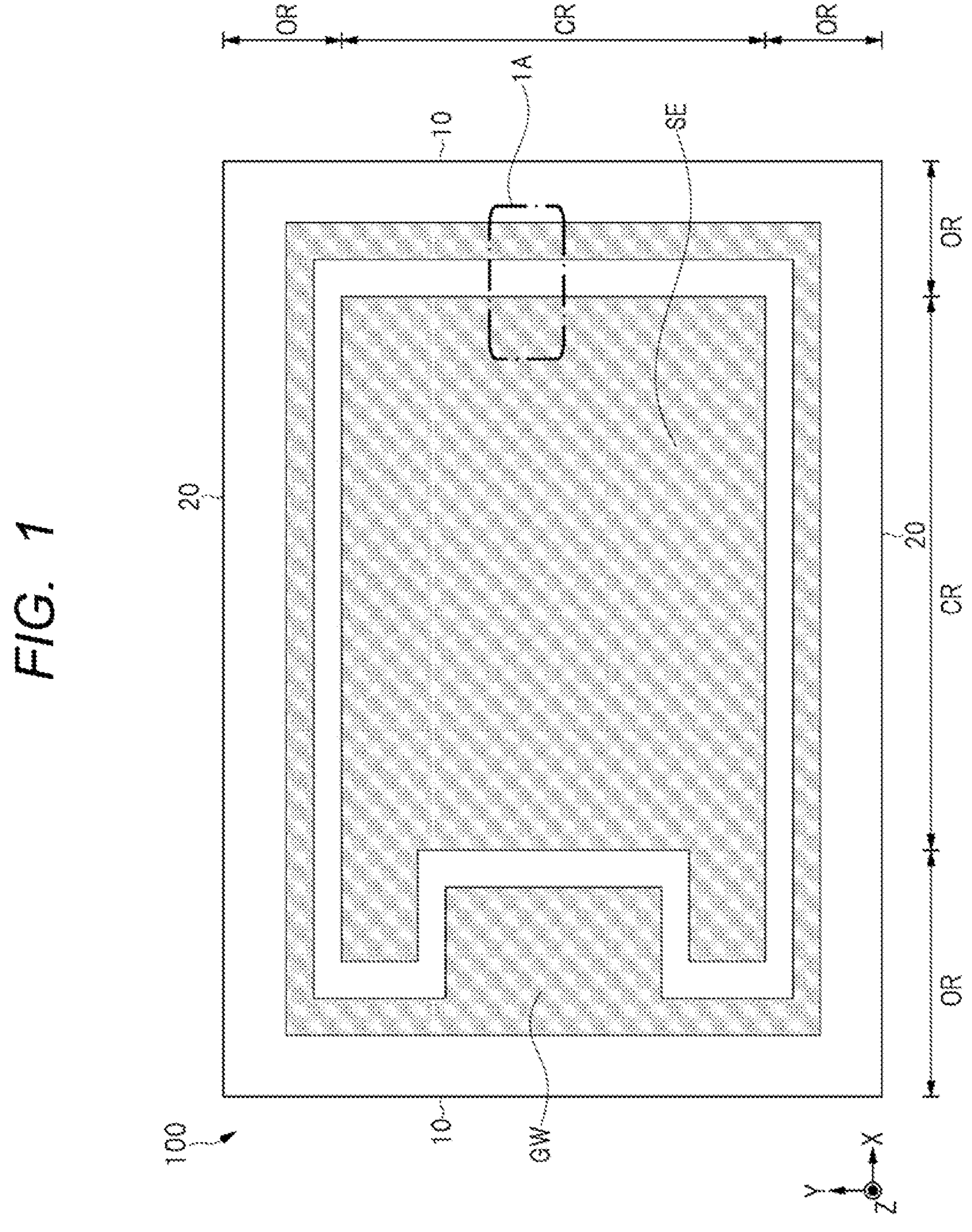
FIG. 1 is a plan view indicating a semiconductor device in a first embodiment.

In the following, embodiments are described in detail based on drawings. In all the drawings for explaining the embodiments, members having the same functions are denoted by the same reference numerals, and repetitive descriptions thereof are omitted. In the following embodiments, descriptions of the same or similar parts will not be repeated in principle except when particularly necessary.

In addition, the X direction, the Y direction, and the Z direction described in the present application intersect each other and are orthogonal to each other. In the present application, the Z direction is described as a vertical direction, depth direction, a height direction or a thickness direction of a certain structure. In addition, the expression “plan view” used in the present application means that the plane formed by the X direction and the Y direction is a “plane” and the “plane” is viewed from the Z direction.

First Embodiment

Structure of Semiconductor Device

Figure 2:
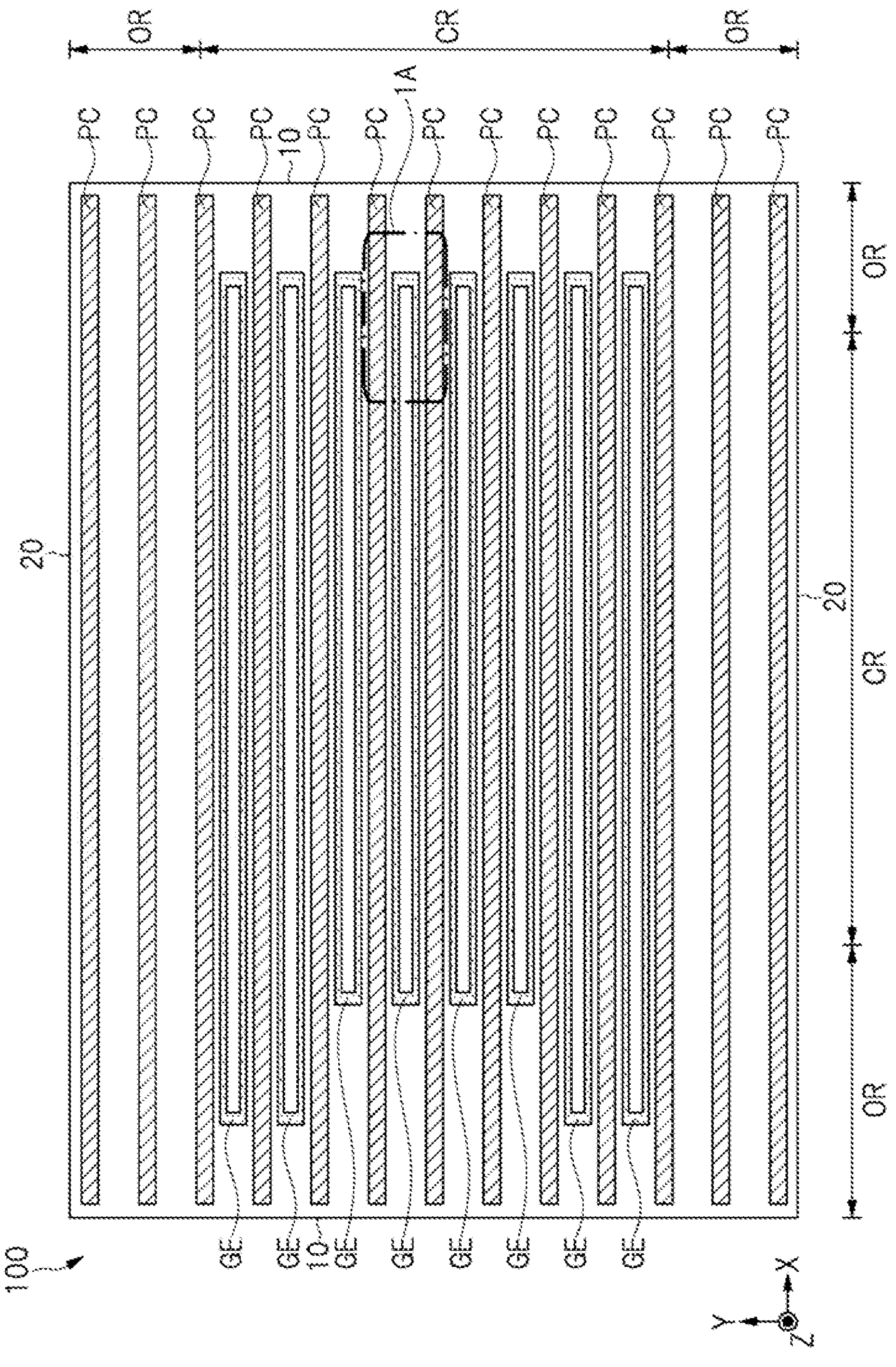
FIG. 2 is a plan view indicating the semiconductor device in the first embodiment.

A semiconductor device 100 in first embodiment will be described below with reference to FIG. 1 to FIG. 5. FIG. 1 and FIG. 2 are plan view of a semiconductor chip as a semiconductor device 100. FIG. 1 shows a layout of wirings formed above a semiconductor substrate SUB, and FIG. 2 mainly shows a layout of a gate-electrode GE and a p-type column area PC formed in the semiconductor substrate SUB.

As shown in FIG. 1, the semiconductor device 100 has a cell region CR in which main semiconducting elements such as a plurality of MOSFET are formed, and an outer peripheral region OR surrounding the cell region CR in plan view. More specifically, the cell region CR is a region in which the source region NS is formed, and is a region that operates as a MOSFET.

The cell area CR is covered with the source-electrode SE. A gate wiring GW is formed on an outer periphery of the source-electrode SE. The gating wiring GW is formed along the outer edges 10, 20 of the semiconductor substrate SUB. The outer edge 10 is an outer edge along the Y direction, and the outer edge 20 is an outer edge along the X direction.

Although not illustrated here, the source-electrode SE and the gate wiring GW are covered with a protective film such as a polyimide film. Openings are provided in parts of the protective film, and a source electrode SE and a gate wiring GW exposed in the openings serve as a source pad and a gate pad. An external connecting member is connected to the source pad and the gate pad, so that the semiconductor device 100 is electrically connected to another semiconductor chip, a lead frame, a wiring substrate, or the like. The external connection member is, for example, a wire made of aluminum, gold, or copper, or a clip made of a copper plate.

As shown in FIG. 2, the gate-electrode GE and the p-type column regions PC extend in the X-direction. The column region PC is formed not only in the cell region CR but also in the outer peripheral region OR, and extends in the X-direction from one outer edge 10 of the semiconductor substrate SUB toward the other outer edge 10 of the semiconductor substrate SUB. As one of the main features of first embodiment, all column regions PC formed in the semiconductor substrate SUB extend in the X-direction.

Figure 3:
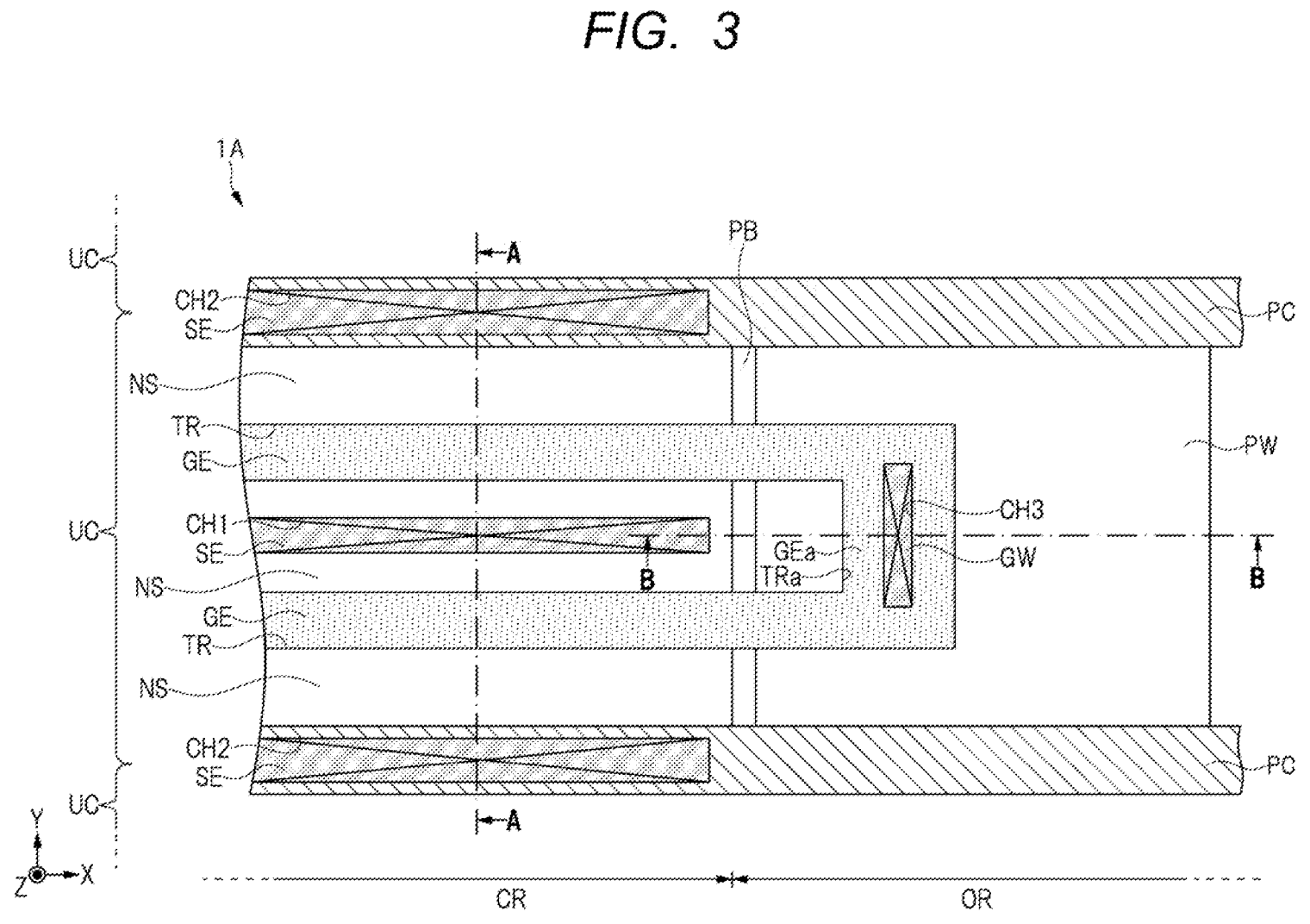
Figure 4:
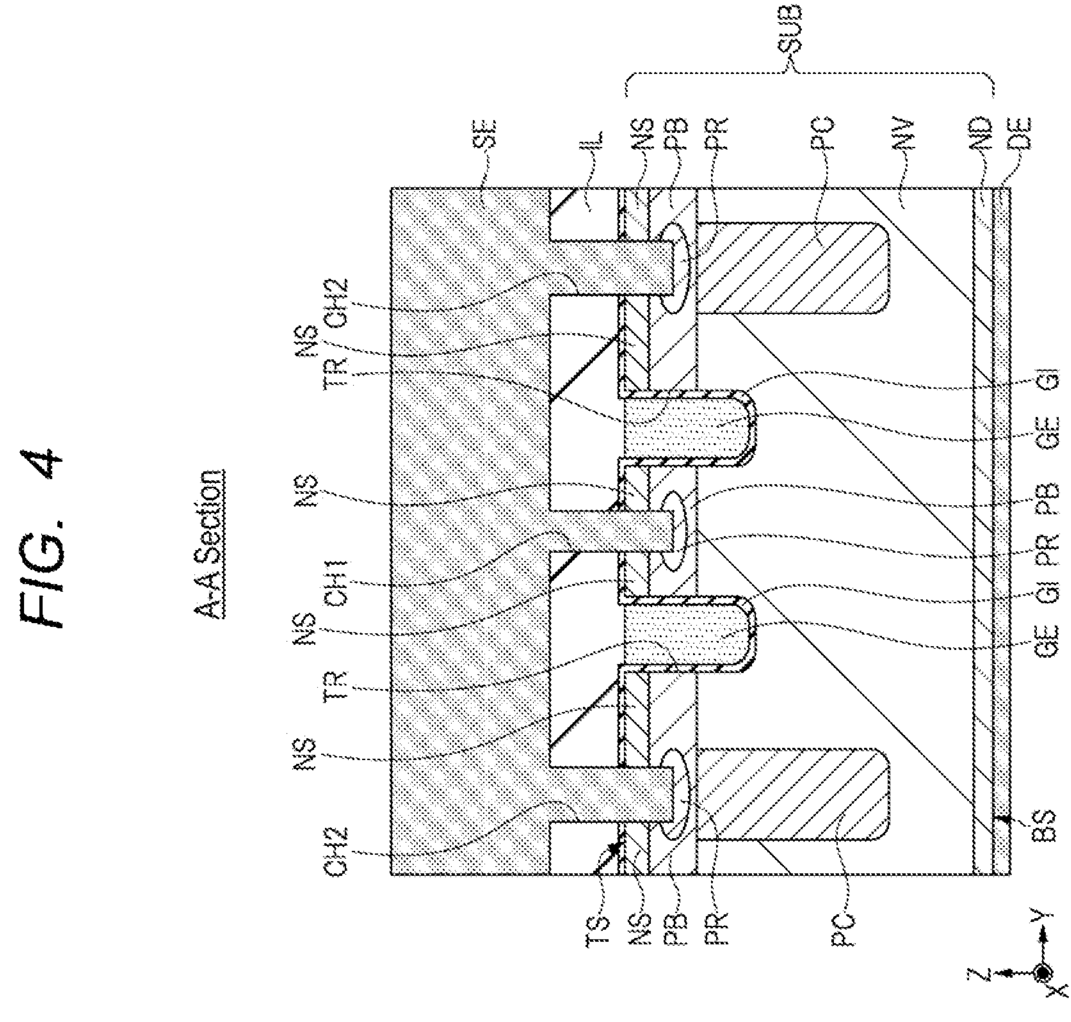
FIG. 4 is a cross-sectional view indicating the semiconductor device in the first embodiment.
Figure 5:
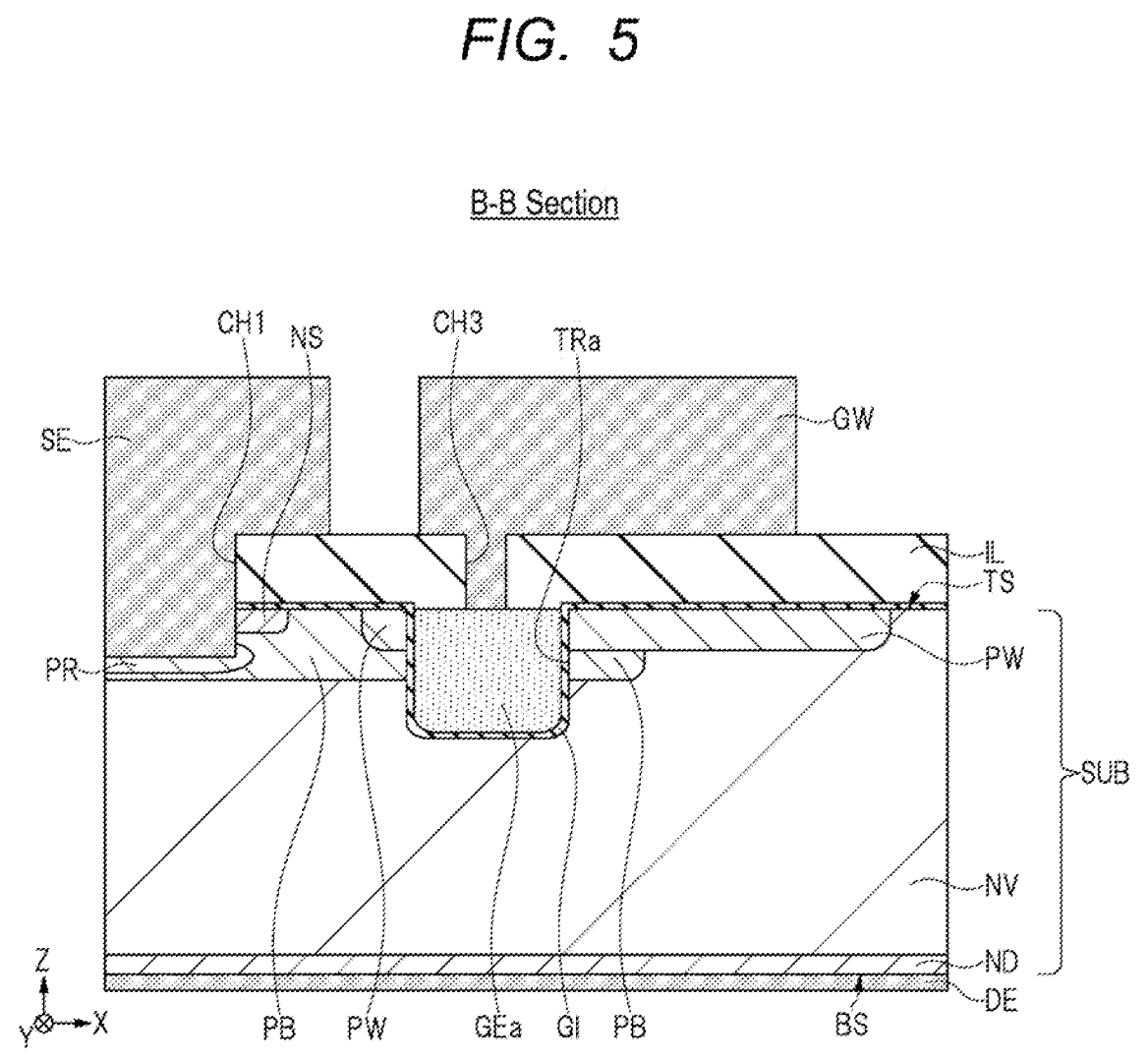

FIG. 3 is an enlarged main portion plan view of the region 1A shown in FIGS. 1 and 2. In FIG. 3, the planar layout of an upper surface TS of the semiconductor substrate SUB is mainly shown, and the gate wiring GW and the source-electrode SE are not shown except for the inside of the holes CH1, CH2, and CH3. FIG. 4 is a cross-sectional view along a line A-A shown in FIG. 3. FIG. 5 is a cross-sectional view along a line B-B shown in FIG. 3.

As shown in FIG. 3, the semiconductor device 100 of first embodiment includes a plurality of unit cells UC, each unit cell UC structure a multi-trench SJ configuration. The two unit cells UC adjoining each other in the Y-direction are arranged so that the column regions PC are folded back in common.

FIG. 4 shows a cross-sectional configuration of one unit cell UC. The semiconductor device 100 comprises an n-type semiconductor substrate SUB having an upper surface TS and a bottom surface BS. The semiconductor substrate SUB is made of n-type silicon and includes an n-type drift region (impurity region) NV and an n-type drain region (impurity region) ND having an impurity concentration higher than that of the drift region NV. Here, the semiconductor substrate SUB is a stack of an n-type silicon substrate and an n-type silicon layer grown by introducing phosphorus (P) onto the silicon substrate by an epitaxial growth method. The n-type silicon substrate constitutes the drain region ND, and the n-type silicon layer constitutes the drift region NV.

A drain-electrode DE is formed below the lower surface BS of the semiconductor substrate SUB. The drain-electrode DE is electrically connected to the drain region ND and supplies a drain potential to the drain region ND and the drift-region NV (semiconductor substrate SUB). The drain electrode DE consists of a single layer of a metallic membrane, such as an aluminum membrane, a titanium membrane, a nickel membrane, a gold membrane or a silver membrane, or a laminated membrane with these metallic membranes laminated accordingly.

In semiconductor substrate SUB, a p-type body region (impurity region) PB is formed on the upper surface TS side of the semiconductor substrate SUB. Specifically, as shown in FIG. 4, in the semiconductor substrate SUB, at a position closer to the upper surface TS of the semiconductor substrate SUB than to the lower surface BS of the semiconductor substrate SUB, a body region (impurity region) PB is formed. In addition, an n-type source region (impurity region) NS is formed in the body region PB. The source region NS has a higher impurity concentration than the drift region NV. As will be described later, the source region NS is a region formed in the body region PB after the body region PB is formed in the semiconductor substrate SUB.

A pair of p-type column regions (impurity regions) PC are formed in the semiconductor substrate SUB located below the body region PB. The column region PC has a higher impurity concentration than the body region PB. In first embodiment, the column region PC is in contact with the body region PB in the Z-direction.

In the semiconductor substrate SUB, so as to reach a predetermined depth from the upper surface TS of the semiconductor substrate SUB, a pair of trenches TR is formed. The depth of the trenches from the upper surface TS of the semiconductor substrate SUB is deeper than the depth of each of the source-region NS and the body-region PB from the upper surface TS of the semiconductor substrate SUB, and shallower than the depth of the column-region PC from the upper surface TS of the semiconductor substrate SUB.

Inside the pair of trenches TR, a pair of gate-electrodes GE are formed via a gate insulating film GI. The gate insulating film GI is, for example, a silicon oxide film. The gate electrode GE is, for example, a polycrystalline silicon film in which n-type impurities are implanted.

As shown in FIGS. 3 and 5, the ends of the pair of trenches TR in the X-direction are connected to each other by a connecting portion TRa. The connecting portion TRa is integrated with the pair of trenches TR and extends in the Y-direction. Inside the connecting portion TRa, a lead-out portion GEa integrated with the pair of gate-electrodes GE is formed via a gate insulating film GI.

The source-region NS is formed to the vicinity of the connecting portion TRa while being in contact with both side surfaces of each of the pair of trenches TR. The source-region NS is not formed in the outer peripheral region OR. That is, the source-region NS is not formed between the connecting portion TRa and the outer edge 10 of the semiconductor substrate SUB.

Four paths from the source region NS contacting both sides of each of the two trenches TR to the body region PB, the drift region NV, and the drain region ND become current paths of the unit cell UC. Since the multi-trench SJ structure has a "two-trenches four-channels structure" and a lot of current paths can be obtained, the on-resistance can be reduced.

A p-type well region (impurity region) PW is formed in the semiconductor substrate SUB of the outer peripheral region OR. The depth of the well region PW from the upper surface TS of the semiconductor substrate SUB is shallower than the depth of each of the body region PB and the column region PC from the upper surface TS of the semiconductor substrate SUB. The column region PC has a higher impurity concentration than the well region PW. In plan view, the well region PW is formed between the pair of column regions PC and is in contact with the pair of column regions PC.

As shown in FIGS. 4 and 5, an interlayer insulating film IL is formed on the upper surface TS of the semiconductor substrate SUB so as to cover the pair of trenches TR. The interlayer insulating film IL is, for example, a silicon oxide film. The thickness of the interlayer insulating film IL is, for example, 600 nm or more and 1500 nm or less.

As shown in FIG. 4, a hole CH1 and a pair of holes CH2 are formed in the interlayer insulating film IL. The hole CH1 penetrates through the interlayer insulating film IL and reaches the source-region NS and the body-region PB located between the pair of trenches TR. Each of the pair of holes CH2 penetrates through the interlayer insulating film IL and reaches the source-region NS and the body-region PB located above the pair of column regions PC. A high-concentration region (impurity region) PR having an impurity concentration higher than that of the body region PB is formed in the body region PB around the bottom of each of the hole CH1 and the pair of holes CH2.

As shown in FIG. 5, a hole CH3 is also formed in the interlayer insulating film IL. The hole CH3 penetrates through the interlayer insulating film IL and reaches the lead-out portion GEa of the gate-electrode GE.

As shown in FIG. 4, the source-electrode SE is formed on the interlayer insulating film IL so as to fill the inside of the hole CH1 and the inside of the pair of holes CH2. The source region NS, the body region PB, and the high-concentration region PR are electrically connected to the source electrode SE through the hole CH1 or the pair of holes CH2. The source potential is supplied from the source electrode SE to the source region NS, the body region PB, and the high-concentration region PR. In first embodiment, since the column region PC is in contact with the body region PB, the column region PC is also electrically connected to the source electrode SE, and the source potential is supplied from the source electrode SE to the column region PC.

As shown in FIG. 5, a gate wiring GW is also formed on the interlayer insulating film IL so as to fill the inside of the hole CH3. The lead-out portion GEa of the gate electrode GE is electrically connected to the gate wiring GW via the hole CH3. A gate potential is supplied from the gate electrode GE to the gate electrode GE.

The source-electrode SE and the gate wiring GW include a barrier metal film and a conductive film formed on the barrier metal film. The barrier metal film is, for example, a TiN film. The conductive film is, for example, an aluminum alloy film to which copper or silicon is added. The aluminum-alloy film is a main conductive film of a source-electrode SE and a gate wiring GW, and is sufficiently thicker than the TiW film.

Main Features of First Embodiment

As shown in FIGS. 3 and 4, the pair of column regions PC are provided apart from each other in the Y-direction. The pair of trenches TR are provided apart from each other in the Y direction, and are provided between the pair of column regions PC in the Y direction. The pair of column regions PC are separated from the pair of trenches TR in the Y-direction. Note that other column regions PC are not formed between the pair of trenches TR.

As shown in FIG. 3, the pair of trenches TR extends in the X-direction. The pair of column regions PC extend in the X direction while adjoining the pair of trenches TR, and extend in the X direction toward the outer edge 10 of the semiconductor substrate SUB beyond the connecting portion TRa. That is, the pair of column regions PC not only extend in the X direction in the cell region CR, but also extend in the X direction in the outer peripheral region OR. As shown in FIG. 2, all the column regions PC formed in the semiconductor substrate SUB extend only in the X-direction.

In examined example described with reference to FIG. 12, when the width W1 is changed in order to design an optimum on-resistance according to the product-specification required in the market, the distance L1 needs to be adjusted in order to ensure the withstand voltage. Therefore, it is necessary to manufacture a prototype corresponding to the width W1 and the multiplier of the distance L1, and the development cost is increased and the development is prolonged.

Figure 12:
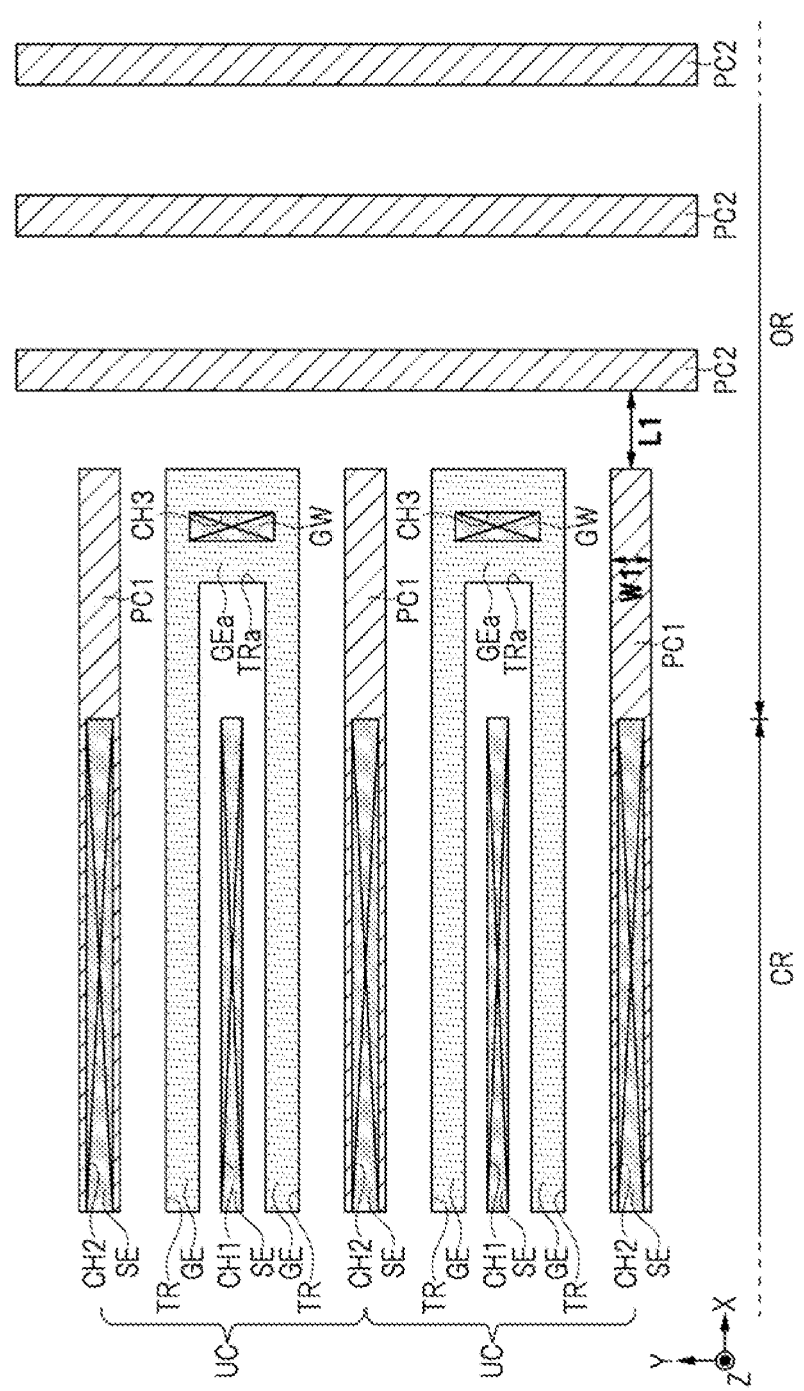
FIG. 12 is a main portion plan view indicating semiconductor device in an examined example.

According to first embodiment, the width of the column region PC in the Y direction (width W1) needs to be adjusted according to the product-specification, but since the column region PC extends only in the X direction, the adjustment of the distance L1 in FIG. 12 becomes unnecessary. That is, it is easy to make the breakdown voltage in the outer peripheral region OR constant. Therefore, it is possible to easily secure the charge balance of achieving both of improvement of the breakdown voltage and reduce of the on-resistance. In addition, an increase in development costs and a prolonged development can be suppressed.

Manufacturing Method of Semiconductor Device

The respective manufacturing steps included in the manufacturing method of the semiconductor device 100 in first embodiment will be described below with reference to FIG. 6 to FIG. 11. FIG. 6 to FIG. 11 are cross-sectional view along A-A line of FIG. 3, similar to FIG. 4, and show a configuration for manufacturing one unit cell UC.

Figure 6:
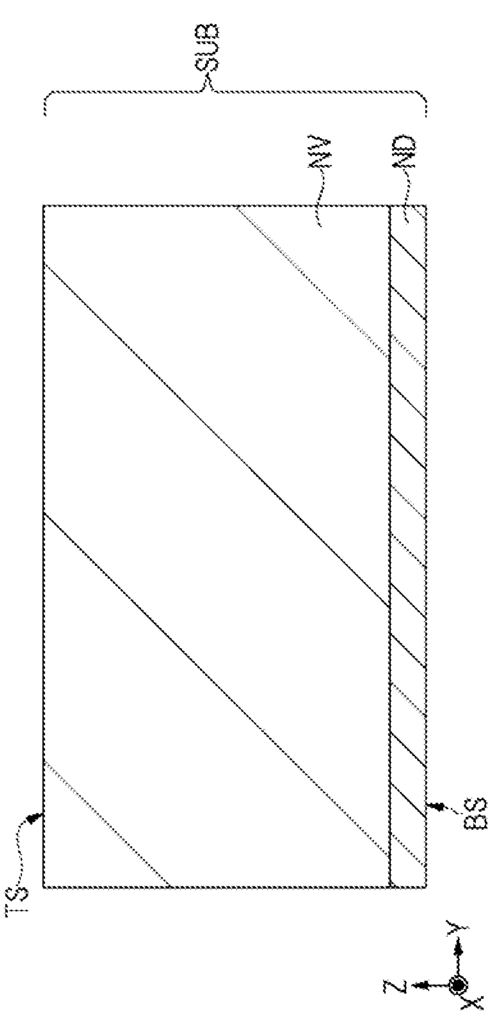
FIG. 6 is a cross-sectional view showing the manufacturing process of the semiconductor device in the first embodiment.

As shown in FIG. 6, an n-type semiconductor substrate SUB having an upper surface TS and a lower surface BS is prepared. The semiconductor substrate SUB is, for example, a stack of an n-type silicon substrate and an n-type silicon layer grown while introducing phosphorus (P) on the silicon substrate by an epitaxial growth method. The n-type silicon substrate constitutes the drain region ND, and the n-type silicon layer constitutes the drift region NV.

Next, a p-type well region PW shown in FIG. 5 is formed in the semiconductor substrate SUB of the outer peripheral region OR by introducing an impurity such as boron (B) by photolithography and ion implantation.

Figure 7:
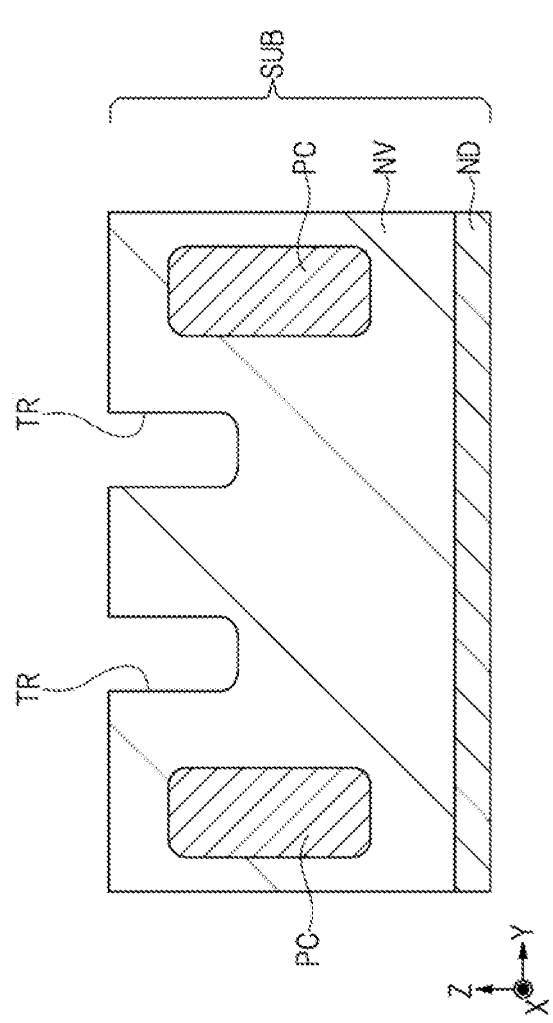
FIG. 7 is a cross-sectional view illustrating a manufacturing process following FIG. 6.

As shown in FIG. 7, a trench TR and a p-type column area PC are formed in the semiconductor substrate SUB.

First, in the semiconductor substrate SUB of a portion of the cell region CR and the outer peripheral region OR, a trench TR is formed by a photolithography technique and an anisotropic etching process so as to reach a predetermined depth from the upper surface TS of the semiconductor substrate SUB. At this time, in the outer peripheral region OR, the connecting portion TRa shown in FIG. 5 is also formed in the semiconductor substrate SUB.

Next, a p-type column region PC is formed in the semiconductor substrate SUB of the cell region CR and the outer peripheral region OR by introducing an impurity such as boron (B) by photolithography and ion implantation. In first embodiment, since only the mask pattern needs to be changed as compared with forming of the column areas PC1, PC2 of examined example, there is no need to add a new manufacturing process.

Figure 8:
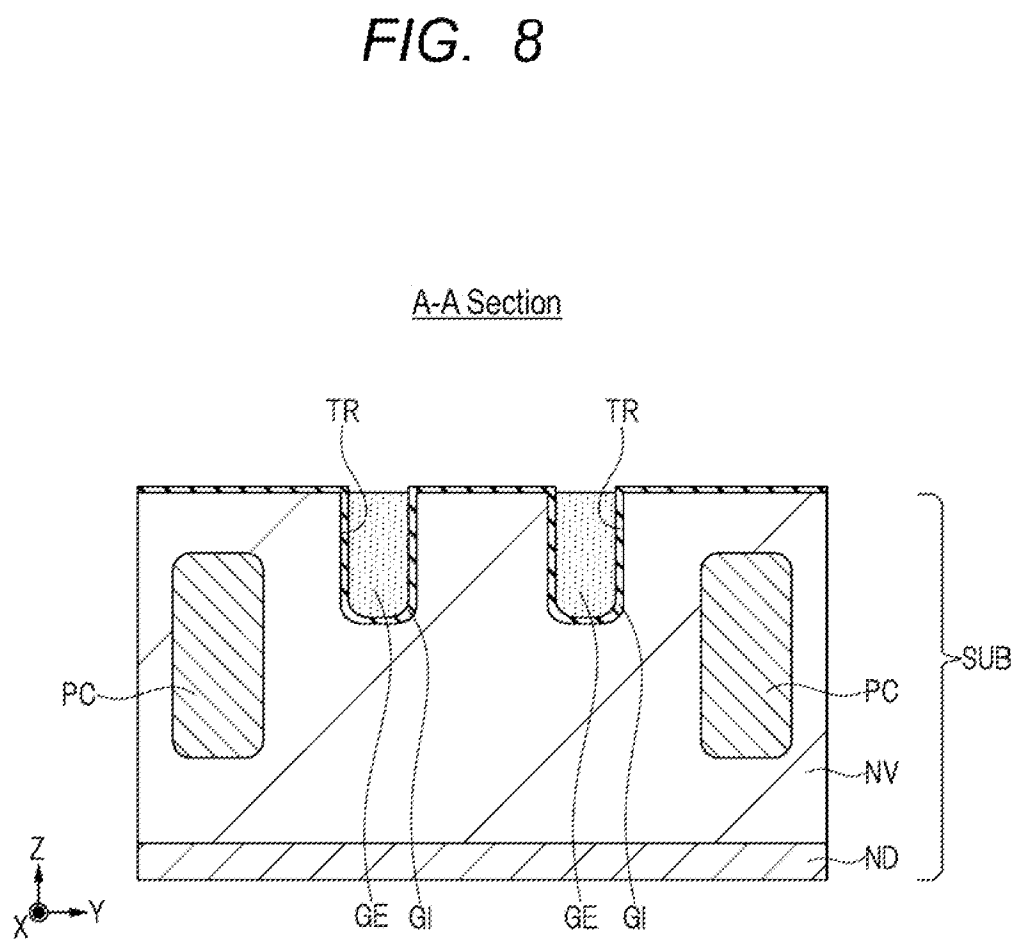

As shown in FIG. 8, a gate-electrode GE is formed inside the trench TR via a gate insulating film GI.

First, a gate insulating film GI made of a silicon-oxide film is formed inside the trench TR and on the upper surface TS of the semiconductor substrate SUB by, for example, a thermal oxidation method. Next, a polycrystalline silicon film into which, for example, n-type impurities are introduced is formed on the upper surface TS of the semiconductor substrate SUB by, for example, CVD (Chemical Vapor Deposition) so as to fill the inside of the trench TR via the gate insulating film GI.

Next, the polycrystalline silicon film located outside the trench TR is removed by a polishing process using, for example, CMP (Chemical Mechanical Polishing) or an anisotropic etching process. The polycrystalline silicon film left in the trench TR becomes the gate-electrode GE. At this time, in the outer peripheral region OR, the lead-out portion GEa illustrated in FIG. 5 is also formed inside the connecting portion TRa via the gate insulating film GI. The Gate insulating film GI located outside the trench TR may be removed by, for example, an isotropic etching process, or may be left.

Figure 9:
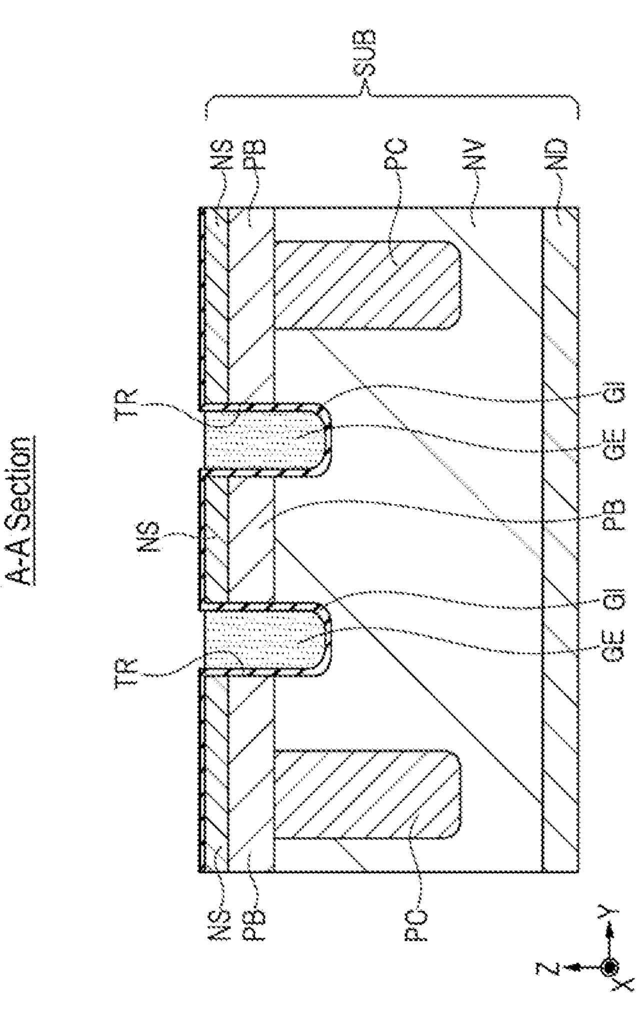
FIG. 9 is a cross-sectional view illustrating a manufacturing step following FIG. 8.

As shown in FIG. 9, a p-type body region PB is formed in the semiconductor substrate SUB, and an n-type source region NS is formed in the body region PB.

First, by introducing an impurity such as boron (B) by photolithography and ion implantation, in the upper surface TS side of the semiconductor substrate SUB, in the semiconductor substrate SUB in the cell region CR and the outer peripheral region OR, a p-type body region PB is formed. Next, an n-type source region NS is formed in the body region PB of the cell region CR by introducing an impurity such as arsenic (As) by photolithography and ion-implantation.

Figure 10:
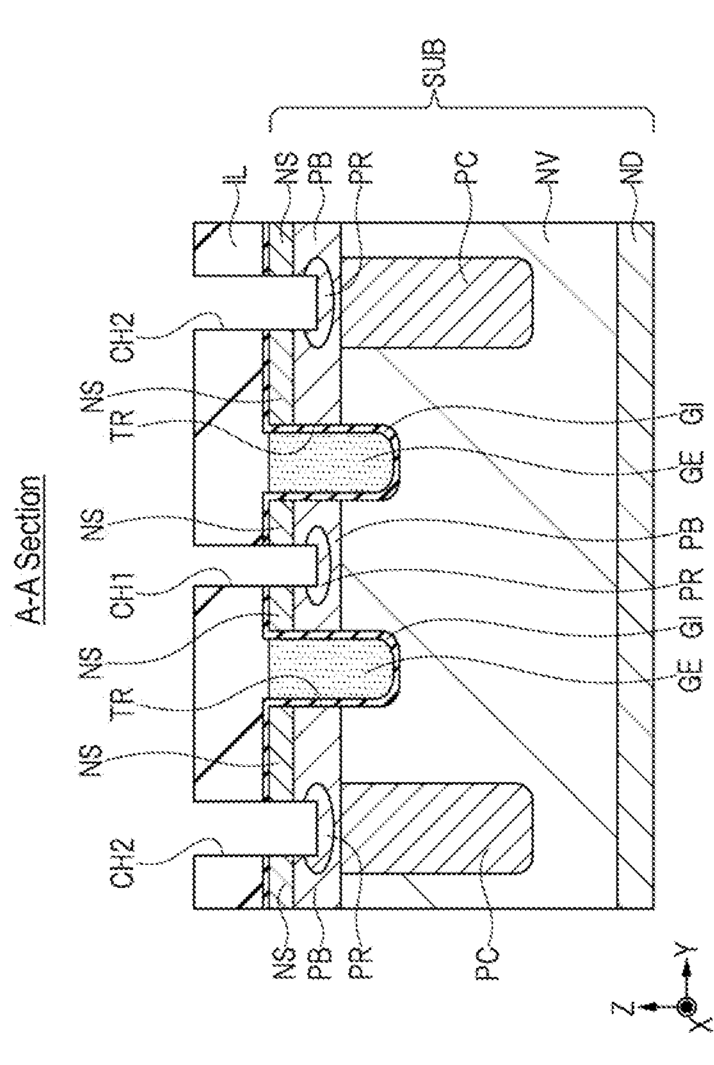
FIG. 10 is a cross-sectional view illustrating a manufacturing process following FIG. 9.

As shown in FIG. 10, an interlayer insulating film IL is formed on the upper surface TS of the semiconductor substrate SUB, a hole CH1 and a hole CH2 are formed in the interlayer insulating film IL, and a high-concentration region PR is formed in the body region PB.

First, an interlayer insulating film IL made of, for example, a silicon oxide film is formed on the upper surface TS of the semiconductor substrate SUB by, for example, a CVD method so as to cover the trench TR. Next, a hole CH1 and a hole CH2 going through the interlayer insulating film IL are formed by a photolithography technique and a dry etching process. The hole CH1 reaches the source-region NS and the body-region PB located between the pair of trenches TR. The hole CH2 reaches the source-region NS and the body-region PB located above the column-region PC.

Next, by introducing an impurity such as boron (B) by ion implantation, a p-type high-concentration region PR is formed in the body region PB at the bottom of each of the hole CH1 and the hole CH2.

Note that the hole CH3 shown in FIG. 5 is also formed in the outer peripheral region OR by the same step as the step of forming the hole CH1 and the hole CH2. The hole CH3 penetrates the interlayer insulating film IL and reaches the lead-out portion GEa of the gate-electrode GE.

Figure 11:
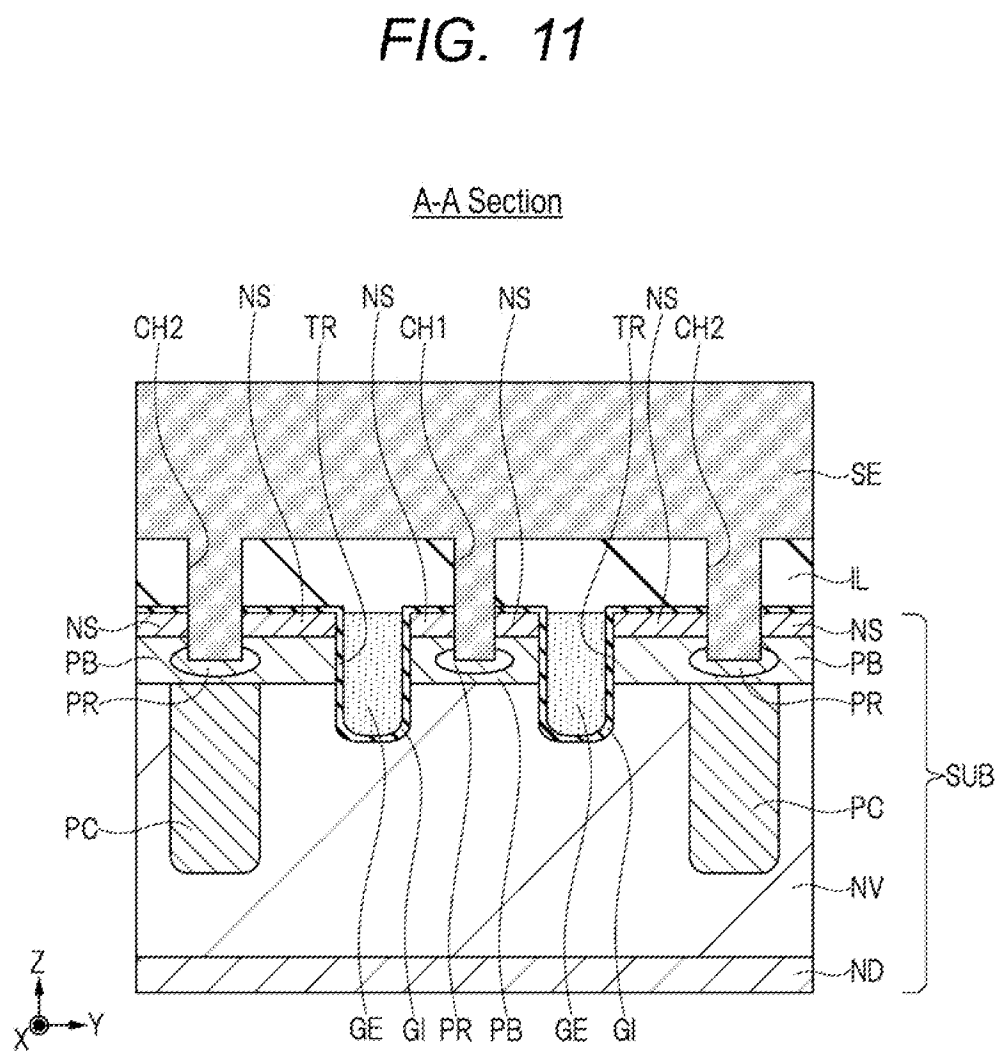

As shown in FIG. 11, the source-electrode SE is formed on the interlayer insulating film IL by a sputtering method or a CVD method so as to fill the inside of each of the hole CH1 and the hole CH2. At this time, a gate wiring GW is also formed on the interlayer insulating film IL so as to fill the inside of the hole CH3.

Thereafter, the structure shown in FIG. 4 is obtained through the following steps. First, the lower surface BS (drain-region ND) of the semiconductor substrate SUB is polished as needed. Next, a drain-electrode DE is formed below the lower surface BS of the semiconductor substrate SUB by, for example, a sputtering method.

Although the present invention has been described in detail based on the above-described embodiment, the present invention is not limited to the above-described embodiment, and can be variously modified without departing from the gist thereof.

What is claimed is:

1. A semiconductor device comprising a plurality of unit cells formed in a semiconductor substrate of a first conductivity type having an upper surface and a lower surface, wherein each of the plurality of the unit cells has:

a body region of a second conductivity type opposite to the first conductivity type formed at a position closer to the upper surface than to the lower surface in the semiconductor substrate;

a source region of the first conductivity type formed in the body region;

a pair of column regions of the second conductivity type formed below the body region in the semiconductor substrate;

a pair of trenches formed in the semiconductor substrate so as to go through the source region and the body region and to reach a predetermined depth from the upper surface of the semiconductor substrate; and a pair of gate electrodes formed inside the pair of the trenches respectively via a gate insulating film, wherein the pair of the column regions are provided apart from each other in a first direction in plan view, wherein the pair of the trenches are provided apart from each other in the first direction, between the pair of the column regions in the first direction, and extending in a second direction orthogonal to the first direction in plan view, wherein edges of respective trenches of the pair of the trenches in the second direction are connected to each other by a connecting portion extending in the first direction, wherein the connecting portion is integrated with the pair of the trenches, wherein the pair of the column regions are extending in the second direction along the pair of the trenches and are extending in the second direction beyond the connecting portion toward an outer edge of the semiconductor substrate, wherein the pair of the column regions are extending only in the second direction, and wherein any column region is not formed between the pair of the trenches.

2. The semiconductor device according to claim 1, wherein the pair of the column regions are extending only in the second direction.

3. The semiconductor device according to claim 2, wherein all column regions formed in the semiconductor substrate and including the pair of the column regions are extending in the second direction.

4. The semiconductor device according to claim 1, wherein the depth of the pair of the column regions from the upper surface of the semiconductor substrate is deeper than the depth of the pair of the trenches from the upper surface of the semiconductor substrate.

5. The semiconductor device according to claim 1, wherein any column region is not formed between the pair of the trenches.

6. The semiconductor device according to claim 1, wherein the source region is formed to the vicinity of the connecting portion while being in contact with both sides of each of the pair of the trenches, and the source region is not formed between the connecting portion and the outer edge of the semiconductor substrate.

* * * * *